United States Patent
Wang et al.

(10) Patent No.: US 10,867,845 B2
(45) Date of Patent: *Dec. 15, 2020

(54) SEMICONDUCTOR DEVICE AND METHOD

(71) Applicant: Taiwan Semiconductor Manufacturing Company, Ltd., Hsinchu (TW)

(72) Inventors: Yu-Sheng Wang, Tainan (TW); Chi-Cheng Hung, Tainan (TW); Ching-Hwanq Su, Tainan (TW); Liang-Yueh Ou Yang, New Taipei (TW); Ming-Hsing Tsai, Chu-Pei (TW); Yu-Ting Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/599,940

(22) Filed: Oct. 11, 2019

(65) Prior Publication Data

US 2020/0043781 A1    Feb. 6, 2020

Related U.S. Application Data

(63) Continuation of application No. 16/213,868, filed on Dec. 7, 2018, now Pat. No. 10,497,615, which is a
(Continued)

(51) Int. Cl.
*H01L 21/768* (2006.01)
*H01L 21/288* (2006.01)
(Continued)

(52) U.S. Cl.
CPC .... *H01L 21/76846* (2013.01); *H01L 21/2885* (2013.01); *H01L 21/76802* (2013.01); *H01L 21/76862* (2013.01); *H01L 21/76864* (2013.01); *H01L 21/76865* (2013.01); *H01L 21/76868* (2013.01); *H01L 21/76873* (2013.01);
(Continued)

(58) Field of Classification Search
CPC ....... H01L 29/41791; H01L 2029/7858; H01L 23/53223; H01L 23/53238; H01L 23/53252; H01L 23/53266; H01L 2221/1073–2221/1089; H01L 21/76838–76895
See application file for complete search history.

(56) References Cited

U.S. PATENT DOCUMENTS 6,271,136 B1    8/2001  Shue et al.
6,319,728 B1   11/2001  Bhan et al.
(Continued)

FOREIGN PATENT DOCUMENTS

KR    20040001538 A    1/2004
KR    20160063378 A    6/2016
KR    20170042938 A    4/2017

*Primary Examiner* — Bac H Au
(74) *Attorney, Agent, or Firm* — Slater Matsil, LLP

(57) ABSTRACT

A method includes forming a first opening in a dielectric layer over a substrate, lining sidewalls and a bottom of the first opening with a conductive barrier layer, and depositing a seed layer over the conductive barrier layer. The method further includes treating the seed layer with a plasma process, and filling the first opening with a conductive material after the treating the seed layer.

14 Claims, 20 Drawing Sheets

Related U.S. Application Data continuation of application No. 15/583,789, filed on May 1, 2017, now Pat. No. 10,157,785.

(51) Int. Cl.
*H01L 29/66* (2006.01)
*H01L 23/532* (2006.01)
*H01L 23/485* (2006.01)
*H01L 29/417* (2006.01)
*H01L 21/285* (2006.01)

(52) U.S. Cl.
CPC ...... *H01L 23/485* (2013.01); *H01L 23/53209* (2013.01); *H01L 23/53266* (2013.01); *H01L 29/41791* (2013.01); *H01L 29/66795* (2013.01); *H01L 21/28518* (2013.01); *H01L 21/28562* (2013.01); *H01L 21/76855* (2013.01)

(56) References Cited

U.S. PATENT DOCUMENTS

| | | |
|---|---|---|
| 7,135,403 B2 | 11/2006 | Park |
| 7,265,038 B2 | 9/2007 | Wu et al. |
| 7,387,962 B2 | 6/2008 | Lee et al. |
| 7,994,049 B2 | 8/2011 | Futase |
| 8,119,525 B2 | 2/2012 | Yu et al. |
| 8,753,975 B1 | 7/2014 | Zhang et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,496,225 B1 * | 11/2016 | Adusumilli ....... H01L 21/76877 |
| 9,520,482 B1 | 12/2016 | Chang et al. |
| 9,576,814 B2 | 2/2017 | Wu et al. |
| 9,691,658 B1 * | 6/2017 | Alptekin ........... H01L 21/76843 |
| 10,157,785 B2 | 12/2018 | Wang et al. |
| 10,269,629 B2 * | 4/2019 | Choi ................. H01L 21/76843 |
| 2003/0082307 A1 | 5/2003 | Chung et al. |
| 2005/0110147 A1 | 5/2005 | Wu et al. |
| 2007/0216031 A1 | 9/2007 | Yang et al. |
| 2010/0314758 A1 | 12/2010 | Wu et al. |
| 2014/0084470 A1 | 3/2014 | Chiang et al. |
| 2015/0093891 A1 | 4/2015 | Zope et al. |
| 2016/0336270 A1 * | 11/2016 | Chen ................ H01L 23/53238 |
| 2017/0103948 A1 | 4/2017 | Lee et al. |
| 2017/0133318 A1 | 5/2017 | Chen et al. |
| 2018/0068889 A1 | 3/2018 | Choi et al. |

* cited by examiner

SEMICONDUCTOR DEVICE AND METHOD

PRIORITY CLAIM AND CROSS-REFERENCE

This application is a continuation of U.S. patent application Ser. No. 16/213,868, filed Dec. 7, 2018 and entitled "Semiconductor Device and Method," which is a continuation of U.S. patent application Ser. No. 15/583,789, filed May 1, 2017 and entitled "Semiconductor Device and Method," now U.S. Pat. No. 10,157,785 issued on Dec. 18, 2018, which applications are hereby incorporated by reference in their entireties.

TECHNICAL FIELD

The present disclosure relates generally to semiconductor device fabrication, and, in particular embodiments, to formation of contacts (also referred to as contact plugs) in semiconductor devices.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As transistor sizes decrease, the size of each feature decreases. In advance processing technologies, the high aspect ratio of contact openings, which will be filled subsequently to form contact plugs, may pose a challenge for conventional gap filling methods used to fill the contact openings. There is a need in the art for processing methods that could accommodate the small feature sizes in advanced process technologies.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
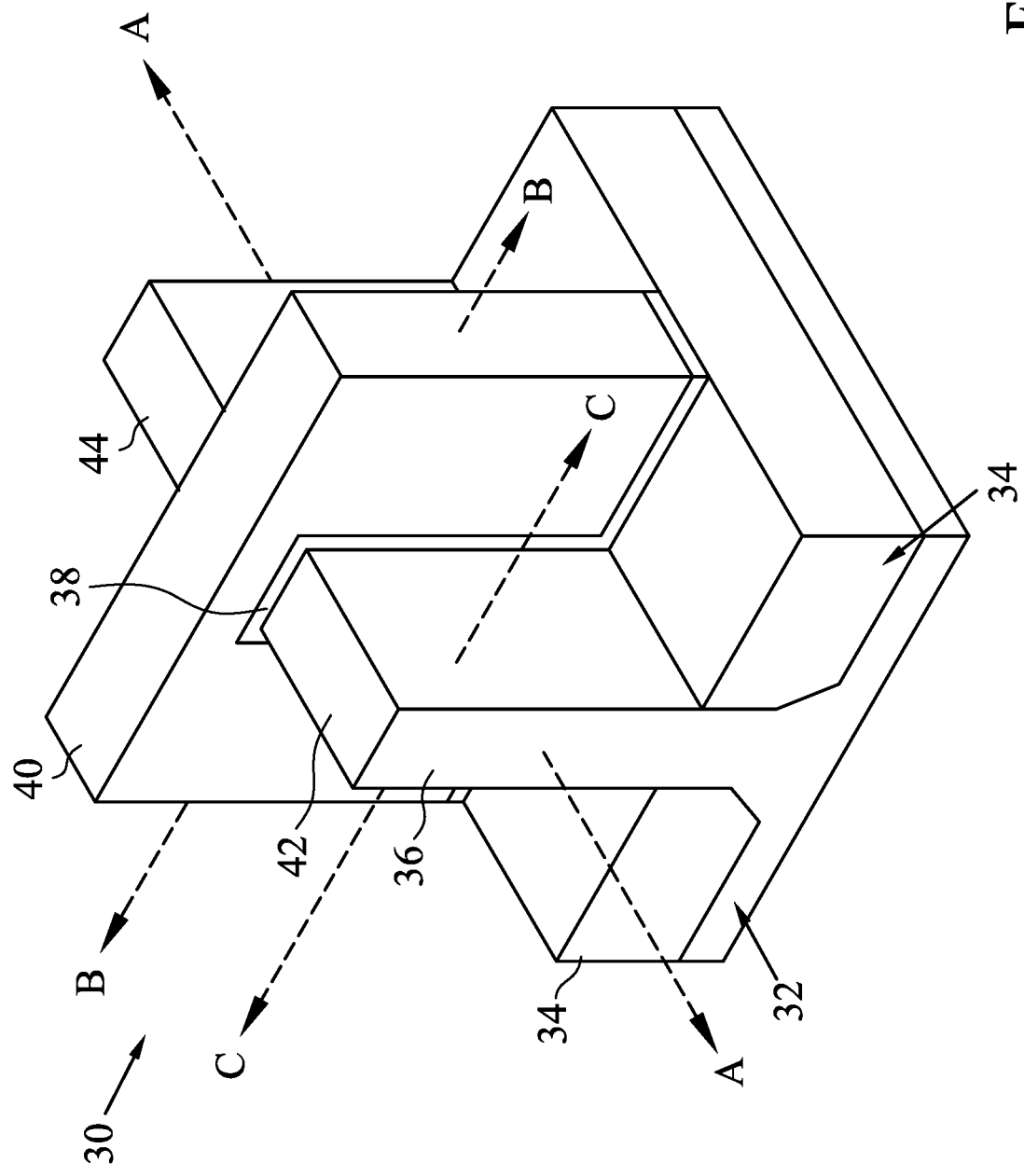
FIG. 1 is a perspective view of a Fin Field-Effect Transistor (FinFET)

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming contact plugs of FinFET devices. However, one skilled in the art will readily appreciate that the methods disclosed in the present disclosure may be used in other devices or applications, e.g., planar devices.

FIG. 1 illustrates an example of a FinFET 30 in a perspective view. The FinFET 30 includes a substrate 32 having a fin 36. The substrate 32 has isolation regions 34 formed thereon, and the fin 36 protrudes above and between neighboring isolation regions 34. A gate dielectric 38 is along sidewalls and over a top surface of the fin 36, and a gate electrode 40 is over the gate dielectric 38. Source/drain regions 42 and 44 are in the fin on opposite sides of the gate dielectric 38 and gate electrode 40. FIG. 1 further illustrates reference cross-sections that are used in later figures. Cross-section B-B extends along a longitudinal axis of the gate electrode 40 of the FinFET 30. Cross-section C-C is parallel to cross-section B-B and is across a source/drain region 42. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

FIGS. 2-16 are cross-sectional views of a FinFET device 100 at various stages of fabrication in accordance with an embodiment. The FinFET device 100 is similar to the FinFET 30 in FIG. 1, except for multiple fins. FIGS. 2-5 illustrate cross-section views of FinFET device 100 along cross-section B-B, and FIGS. 6-16 illustrate cross-section views along cross-section A-A.

Figure 2:
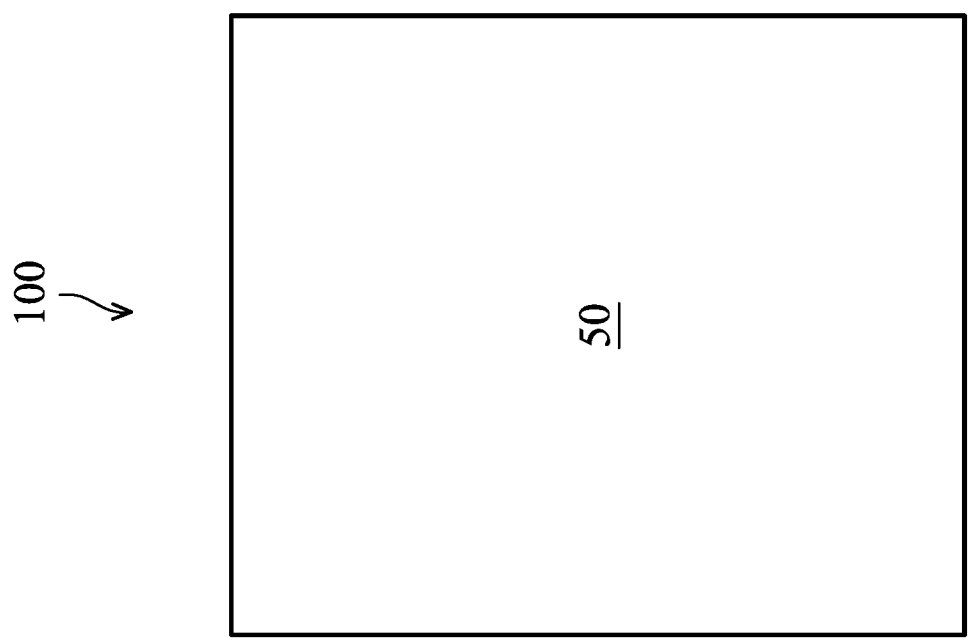
FIGS. 2-16 are cross-sectional views of a FinFET device at various stages of fabrication, in an embodiment.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

Figure 3:
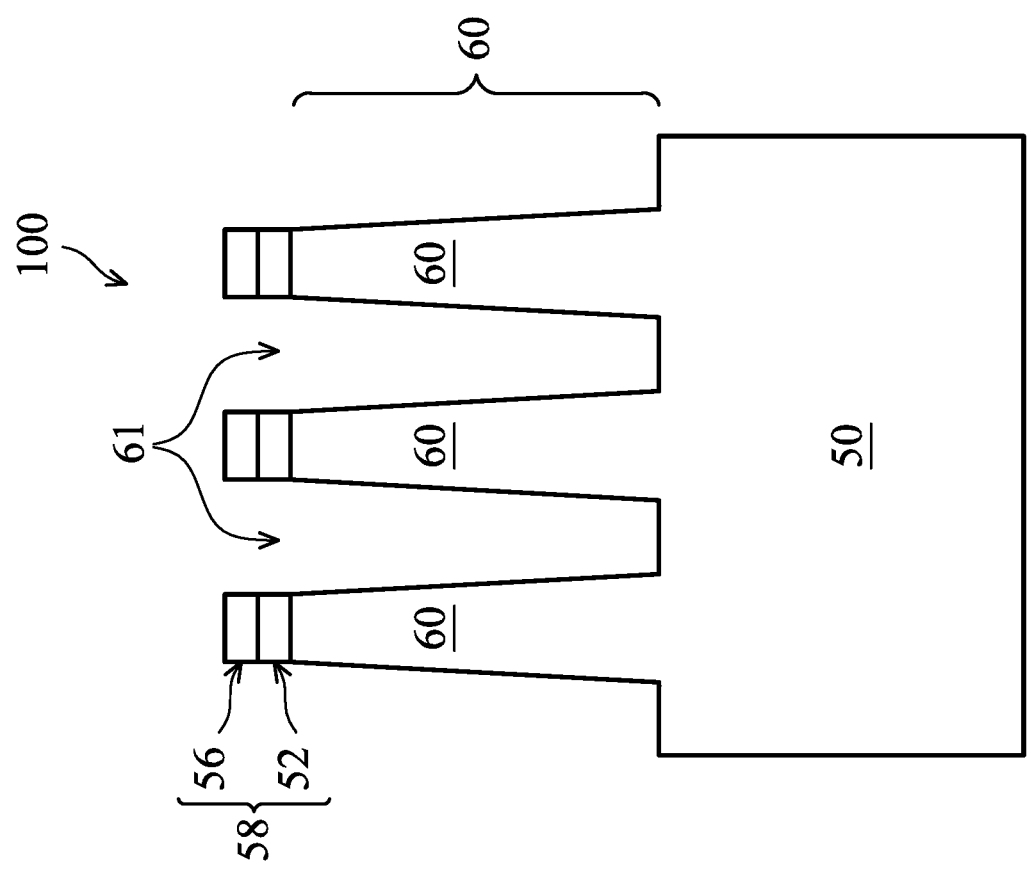

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride 56 to form a patterned mask 58, as illustrated in FIG. 3.

The patterned mask 58 is subsequently used to pattern exposed portions of the substrate 50 to form trenches 61, thereby defining semiconductor strips 60 between adjacent trenches 6i as illustrated in FIG. 3. In some embodiments, the semiconductor strips 60 are formed by etching trenches in the substrate 50 using, for example, reactive ion etch (RIE), neutral beam etch (NBE), the like, or a combination thereof. The etch may be anisotropic. In some embodiments, the trenches 6i may be strips (viewed from in the top) parallel to each other, and closely spaced with respect to each other. In some embodiments, the trenches 6i may be continuous and surround the semiconductor strips 60. After semiconductor strips 60 are formed, the patterned mask layer 58 may be removed by etching or any suitable method.

Figure 4:
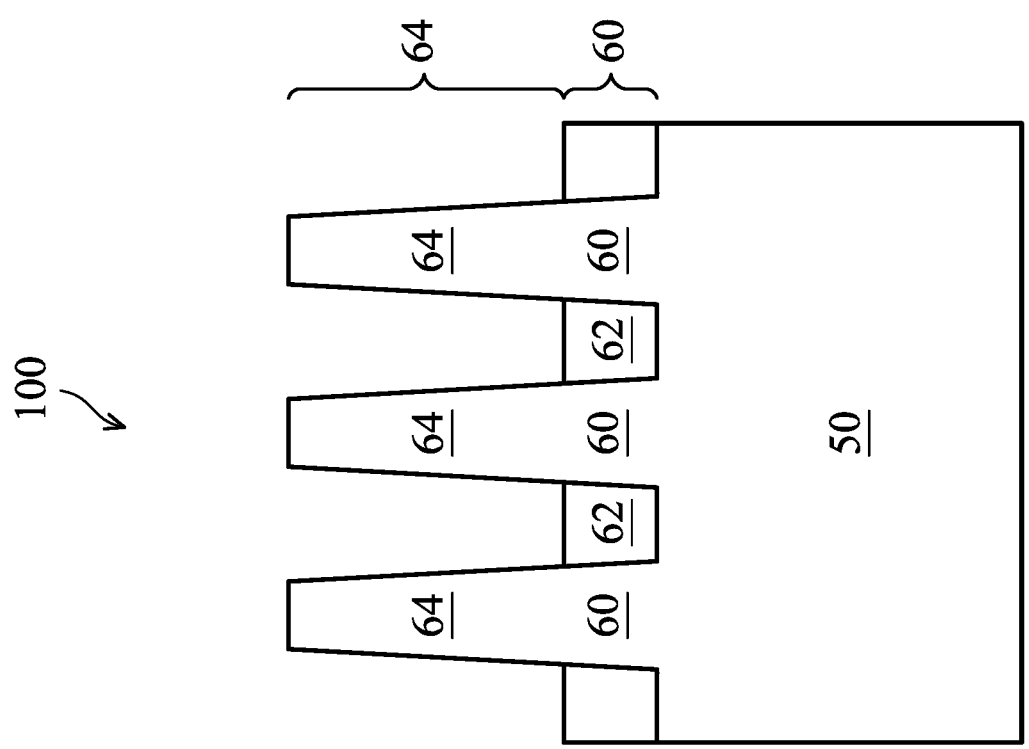

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the patterned mask layer 58) and form top surfaces of the isolation regions 62 and top surfaces of the semiconductor strips 60 that are coplanar (not shown).

In some embodiments, the isolation regions 62 include a liner, e.g., a liner oxide (not shown), at the interface between the isolation region 62 and the substrate 50/semiconductor strip 60. In some embodiments, the liner oxide is formed to reduce crystalline defects at the interface between the substrate 50 and the isolation region 62. Similarly, the liner oxide may also be used to reduce crystalline defects at the interface between the semiconductor strip 60 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor strips 60 protrude from between neighboring isolation regions 62 and form semiconductor fins 64 (also referred to as fins 64). The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor strips can be recessed, and a material different from the semiconductor strips may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
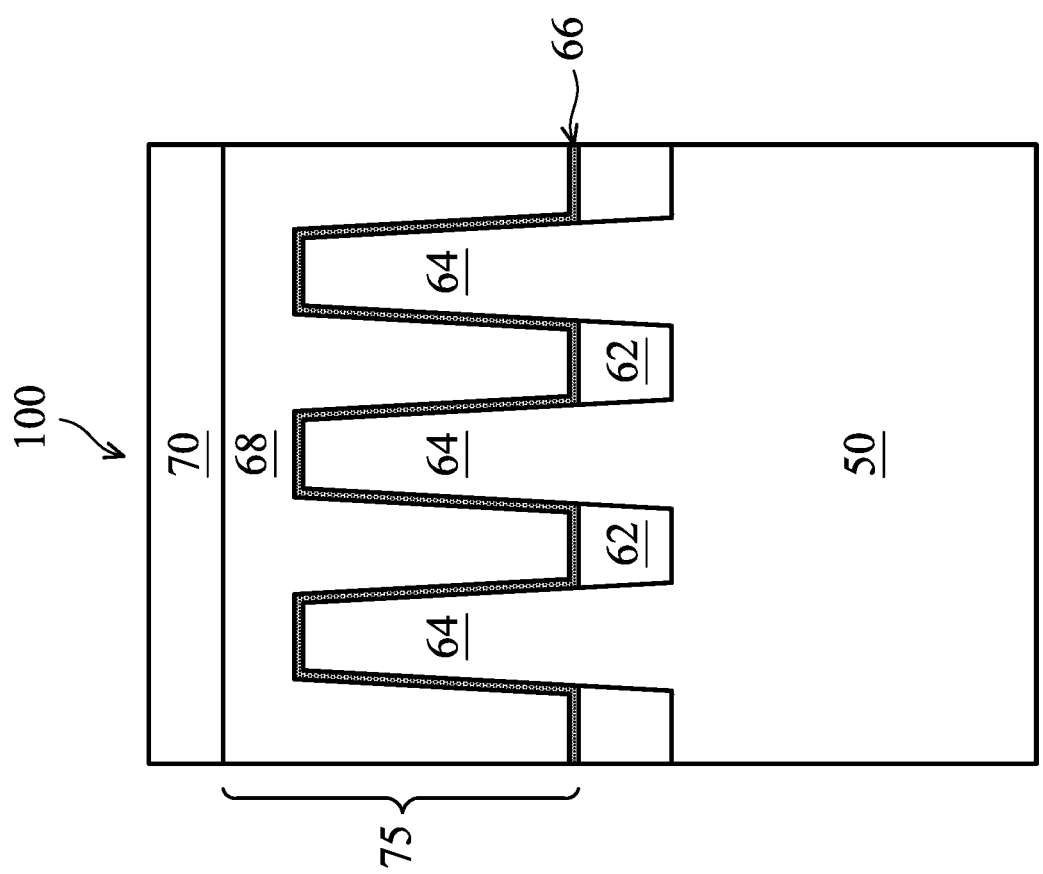

FIG. 5 illustrates the formation of dummy gate structure 75 over the semiconductor fins 64. Dummy gate structure 75 includes gate dielectric 66 and gate 68, in some embodiments. Dummy gate structure 75 may further include mask 70. To form the dummy gate structure 75, a dielectric layer 66 is formed on the semiconductor fins 64 and the isolation regions 62. The dielectric layer 66 may be, for example, silicon oxide, silicon nitride, multilayers thereof, or the like, and may be deposited or thermally grown according to acceptable techniques. In some embodiments, the dielectric layer 66 may be a high-k dielectric material, and in these embodiments, the dielectric layer 66 may have a k value greater than about 7.0, and may include a metal oxide or a silicate of Hf, Al, Zr, La, Mg, Ba, Ti, Pb, multilayers thereof, and combinations thereof. The formation methods of dielectric layer 66 may include molecular-beam deposition (MBD), atomic layer deposition (ALD), plasma-enhanced CVD (PECVD), and the like.

A gate layer 68 is formed over the dielectric layer 66, and a mask layer 70 is formed over the gate layer 68. The gate layer 68 may be deposited over the dielectric layer 66 and then planarized, such as by a CMP. The mask layer 70 may be deposited over the gate layer 68. The gate layer 68 may be formed of, for example, polysilicon, although other materials may also be used. In some embodiments, the gate layer 68 may include a metal-containing material such as TiN, TaN, TaC, Co, Ru, Al, combinations thereof, or multilayers thereof. The mask layer 70 may be formed of, for example, silicon nitride or the like.

After the layers (e.g., 66, 68 and 70) are formed, the mask layer 70 may be patterned using acceptable photolithography and etching techniques to form mask 70. The pattern of the mask 70 then may be transferred to the gate layer 68 and the dielectric layer 66 by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

Figure 6:
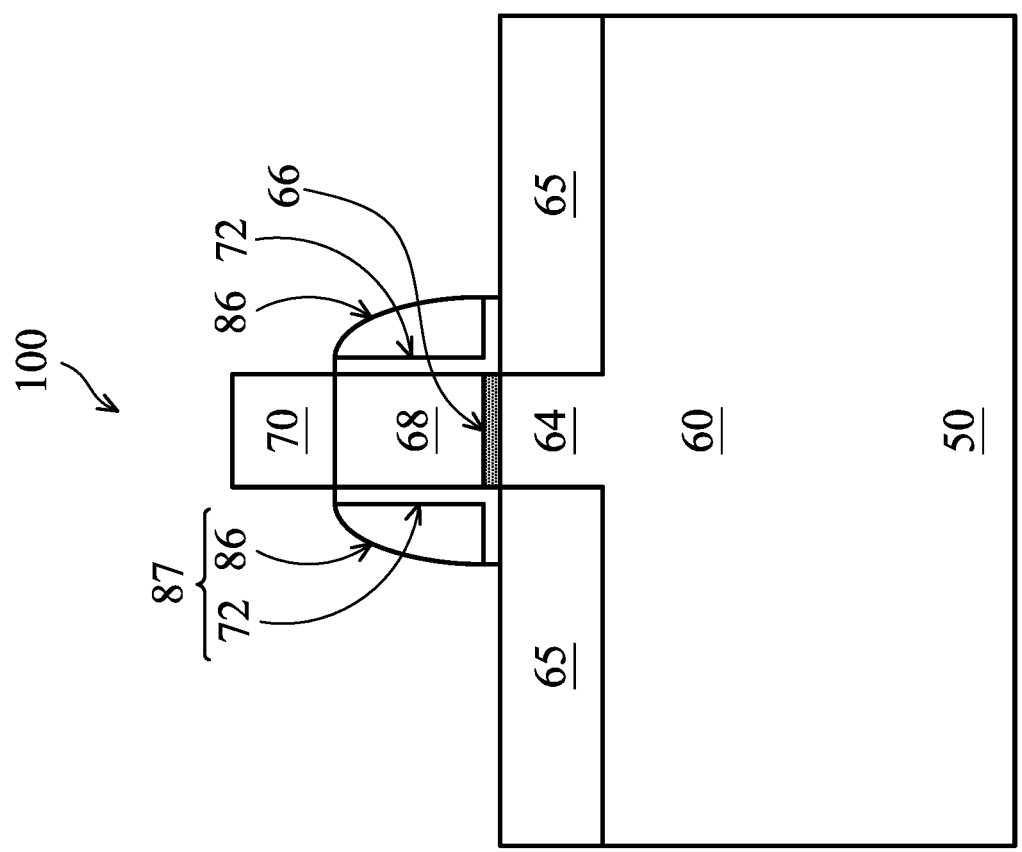

FIGS. 6-16 illustrate the cross-section views of further processing of the FinFET device 100 along cross-section A-A (along a longitudinal axis of the fin). As illustrated in FIG. 6, lightly doped drain (LDD) regions 65 are formed in the fins 64. LDD regions 65 may be formed by a plasma doping process. The plasma doping process may implant N-type or P-type impurities in the fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after first gate spacers 72 are formed.

Still referring to FIG. 6, after the LDD regions 65 are formed, a gate spacer 87 is formed on the gate structure. The gate spacer 87 may include a first gate spacer 72 and a second gate spacer 86. In the example of FIG. 6, the first gate spacer 72 is formed on opposing sidewalls of the gate 68 and on opposing sidewalls of the gate dielectric 66. The first gate spacer 72 may also extend over the upper surface of the semiconductor fin 64 and the upper surface of the isolation region 62 (see FIG. 5). The second gate spacer 86 is formed on the first gate spacer 72, as illustrated in FIG. 6. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, SiCN, a combination thereof, or the like using a suitable deposition method.

In an exemplary embodiment, the gate spacer 87 is formed by first conformally depositing a conformal first gate spacer layer 72 over the FinFET device 100, then conformally depositing a second gate spacer layer 86 over the deposited first gate spacer layer 72. Next, an anisotropic etch process, such as a dry etch process, is performed to remove a first portion of the second gate spacer layer 86 disposed on upper surfaces of the FinFET device 100 (e.g., the upper surface of semiconductor fins 64) while keeping a second portion of the second gate spacer layer 86 disposed along sidewalls of the gate structure. The second portion of the second gate spacer layer 86 remaining after the anisotropic etch process forms the second gate spacer 86. The anisotropic etch process also removes a portion of the first gate spacer layer 72 disposed outside of the sidewalls of the second gate spacer 86, and the remaining portion of the first gate spacer layer 72 forms the first gate spacer 72.

The shapes and formation methods of the first gate spacer 72 and the second gate spacer 86 as illustrated in FIG. 6 are merely non-limiting examples, and other shapes and formation methods are possible. For example, the second gate spacers 86 may be formed after the epitaxial source/drain regions 80 (see FIG. 7) are formed. In some embodiments, dummy gate spacers are formed on the first gate spacer 72 before the epitaxial process of the epitaxial source/drain regions 80 illustrated in FIG. 7 and the dummy gate spacers are removed and replaced with the second gate spacers 86 after the epitaxial source/drain regions 80 are formed.

Figure 7:
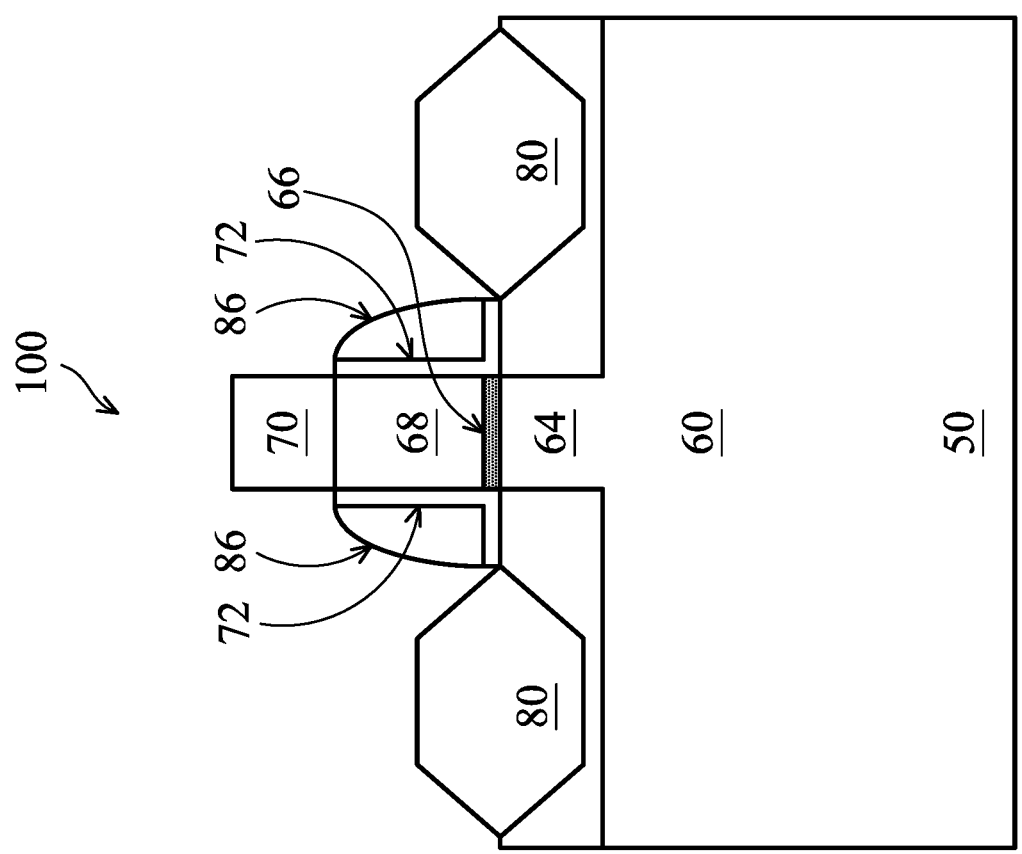

Next, as illustrated in FIG. 7, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. After the epitaxial growth of the source/drain regions 80, mask 70 may be removed by a suitable method, such as etching.

As illustrated in FIG. 7, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 for adjacent fins 64 do not merge together and remain separate source/drain regions 80. In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity (e.g., dopant) concentration in a range from about 1E19 cm−3 to about 1E21 cm−3. In some embodiments, the epitaxial source/drain regions may be in situ doped during growth.

Figure 8:
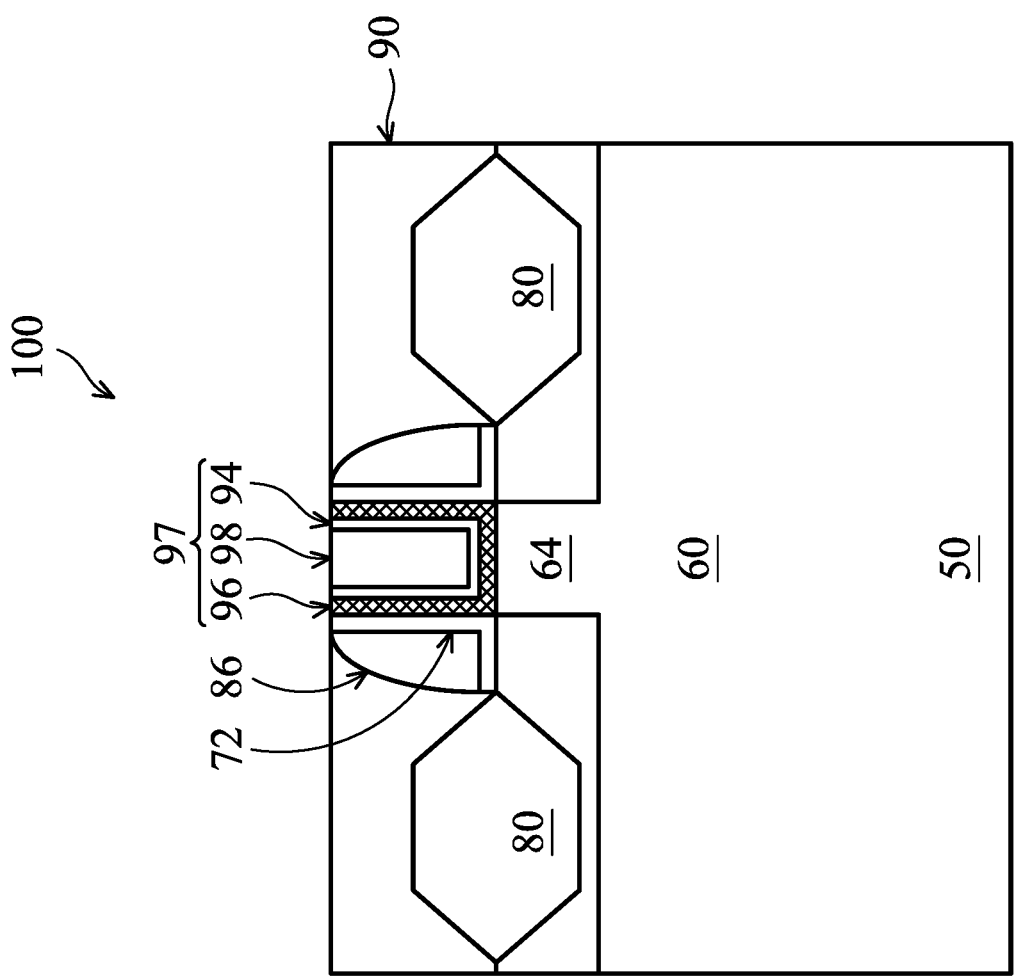

Next, as illustrated in FIG. 8, a first interlayer dielectric (ILD) 90 is formed over the structure illustrated in FIG. 7, and a gate-last process (sometimes referred to as replacement gate process) is performed. In a gate-last process, the gate 68 and the gate dielectric 66 (see FIG. 7) are considered dummy structures and are removed and replaced with an active gate and active gate dielectric.

In some embodiments, the first ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to planarize the top surface of the first ILD 90 such that the top surface of the first ILD 90 is level with the top surface of the gate 68 (see FIG. 7). Therefore, after the CMP process, the top surface of the gate 68 is exposed, in some embodiments.

In accordance with some embodiments, the gate 68 and the gate dielectric 66 directly under the gate 68 are removed in an etching step(s), so that recesses (not shown) are formed in each of the fins 64. Each recess exposes a channel region of a respective fin 64. Each channel region is disposed between neighboring pairs of epitaxial source/drain regions 80. During the dummy gate removal, the dummy gate dielectric layer 66 may be used as an etch stop layer when the dummy gate 68 is etched. The dummy gate dielectric layer 66 may then be removed after the removal of the dummy gate 68.

Further, in FIG. 8, a gate dielectric layer 96, a barrier layer 94 and a gate electrode 98 are formed for replacement gate 97. The gate dielectric layer 96 is deposited conformally in the recess, such as on the top surfaces and the sidewalls of the fins 64 and on sidewalls of the gate spacers 72, and on a top surface of the first ILD 90 (not shown). In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, the barrier layer 94 is formed conformally over the gate dielectric layer 96. The barrier layer 94 may comprise an electrically conductive material such as titanium nitride, although other materials, such as tantalum nitride, titanium, tantalum, or the like, may alternatively be utilized. The barrier layer 94 may be formed using a CVD process, such as plasma-enhanced CVD (PECVD). However, other alternative processes, such as sputtering or metal organic chemical vapor deposition (MOCVD), atomic layer deposition (ALD), may alternatively be used.

Next, the gate electrode 98 is deposited over the barrier layer 94, and fills the remaining portions of the recess. The gate electrode 98 may be made of a metal-containing material such as TiN, TaN, TaC, Co, Ru, Al, combinations thereof, or multi-layers thereof, and may be formed by, e.g., electroplating, electroless plating, or other suitable method. After the formation of the gate electrode 98, a planarization process, such as a CMP, may be performed to remove the excess portions of the gate dielectric layer 96, the barrier layer 94, and the material of the gate electrode 98, which excess portions are over the top surface of first ILD 90. The resulting remaining portions of material of the gate electrode 98, the barrier layer 94, and the gate dielectric layer 96 thus form a replacement gate 97 of the resulting FinFET device 100.

Figure 9:
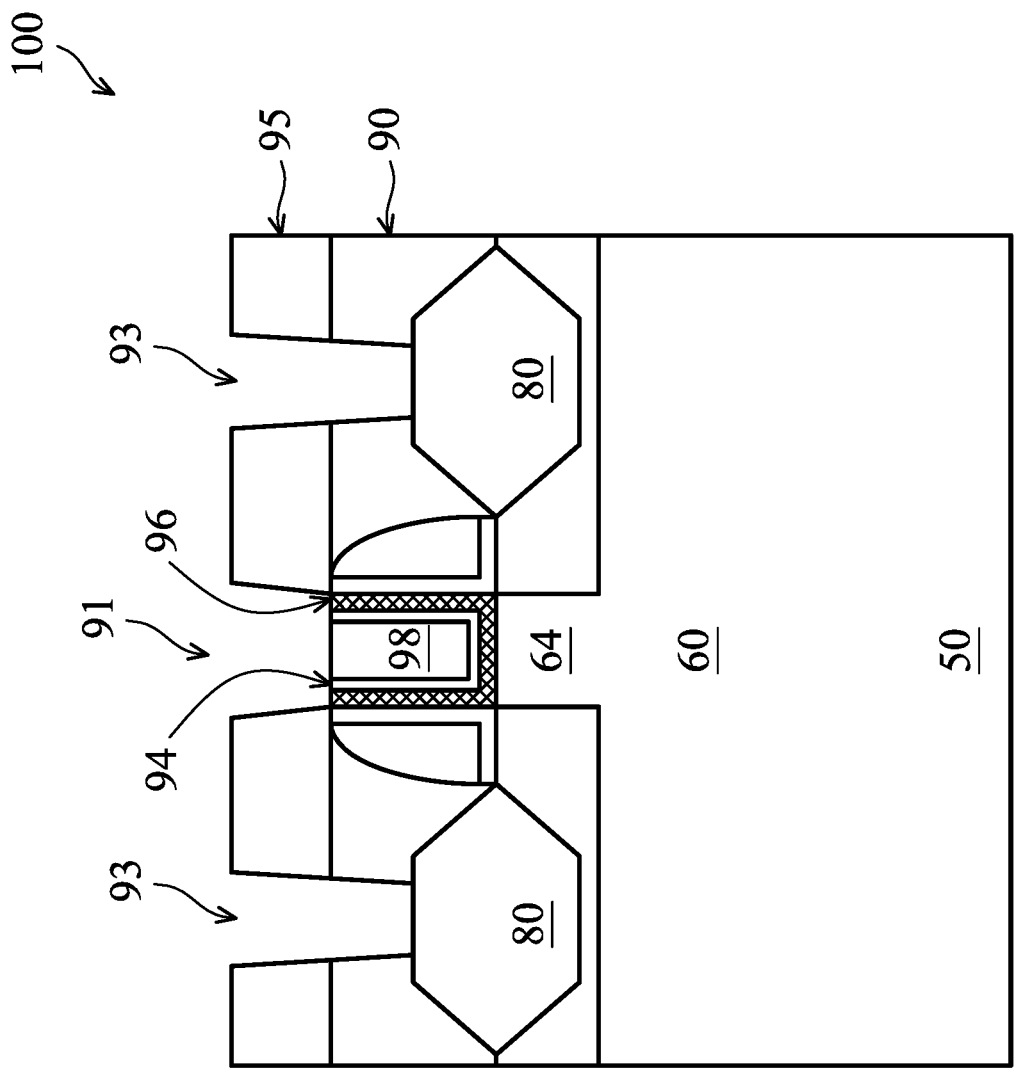

Next, in FIG. 9, a second ILD 95 is deposited over the first ILD 90. In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Contact openings 91 and 93 for contacts 102 (see FIG. 15 or FIG. 19) are formed through the first ILD 90 and/or the second ILD 95. For example, the contact opening 91 is formed through the second ILD 95 and exposes the replacement gate 97, while the contact openings 93 are formed through the first ILD 90 and the second ILD 95, and exposes source/drain regions 80.

Figure 10:
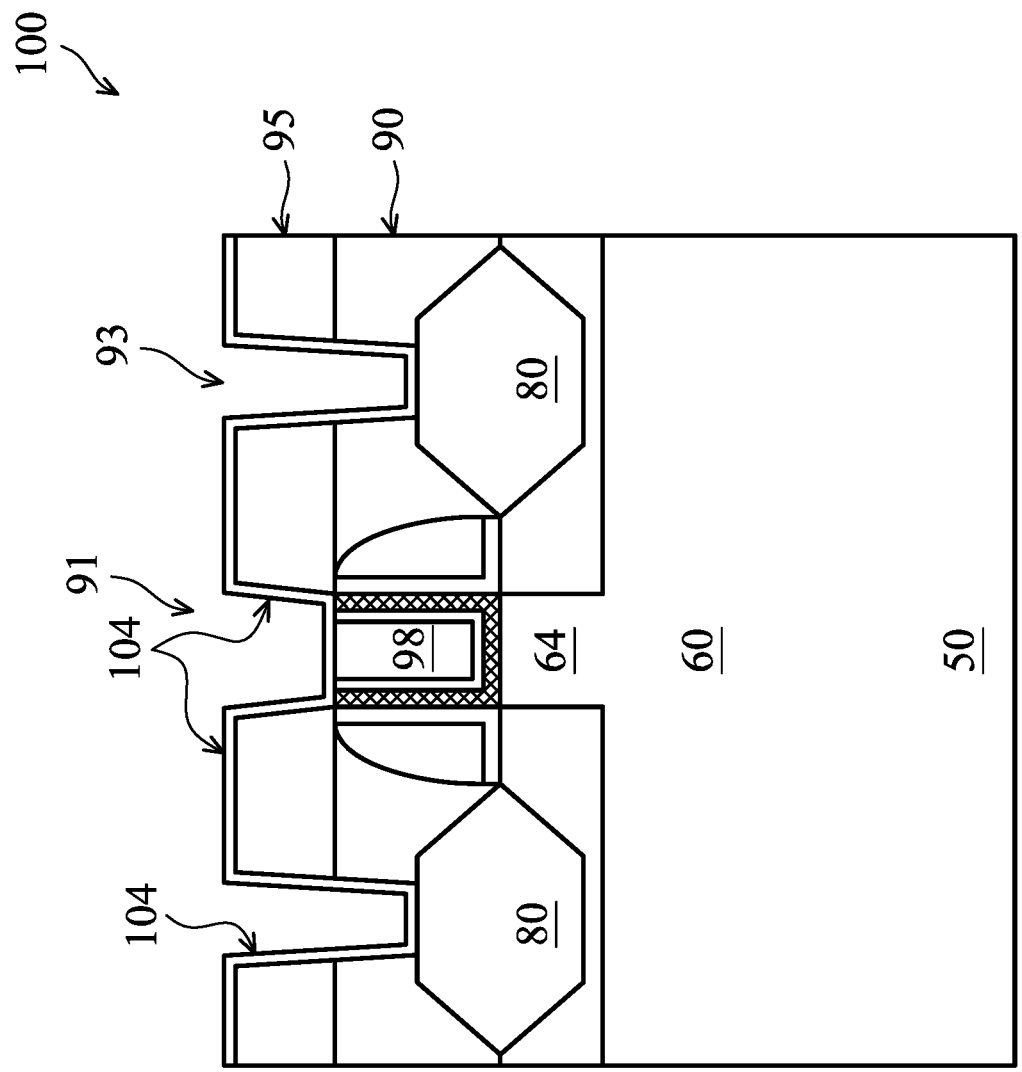

Next, in FIG. 10, a barrier layer 104 is formed over the second ILD 95. In some embodiments, the barrier layer 104 is conformally formed over the second ILD 95 and lines sidewalls and bottoms of the contact openings 91/93. The barrier layer 104 may comprise an electrically conductive material such as titanium (Ti), titanium nitride (TiN), tantalum (Ta), tantalum nitride (TaN), or the like, and may be formed using a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used. The barrier layer 104 may be referred to as a conductive (e.g., electrically conductive) barrier layer in the present disclosure.

In some embodiments, the barrier layer 104 comprises more than one layer of materials. For example, the barrier layer 104 may include a first layer (not individually illustrated) and a second layer (not individually illustrated). The first layer comprises a first electrically conductive layer, and the second layer comprises a second electrically conductive layer different from the first electrically conductive layer. The first layer of the barrier layer 104 may contact the upper surface of the second ILD 95 and sidewalls of the ILDs 90/95 exposed by the contact openings 91/93, the first layer may also contact the epitaxial source/drain regions 80 and the metal gate 97. The second layer of the barrier layer 104 may be conformally formed over the first layer of the barrier layer 104, with the first layer disposed between the first ILDs 90 or the second ILD 95 and the second layer. The first layer of the barrier layer 104 may comprise a first metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys. The first layer of the barrier layer 104 reacts with the epitaxial source/drain regions 80 in a subsequent thermal anneal process to form silicide or germanide regions, in some embodiments. The second layer of the barrier layer 104 may comprise a suitable material (e.g., TaN, TiN) that prevents the diffusion of metal layer no (see FIG. 14). In an exemplary embodiment, the first layer of the barrier layer 104 comprises a metal (e.g., Ta, Ti), and the second layer of the barrier layer 104 comprises a metal nitride (e.g., TaN, TiN).

Figure 11:
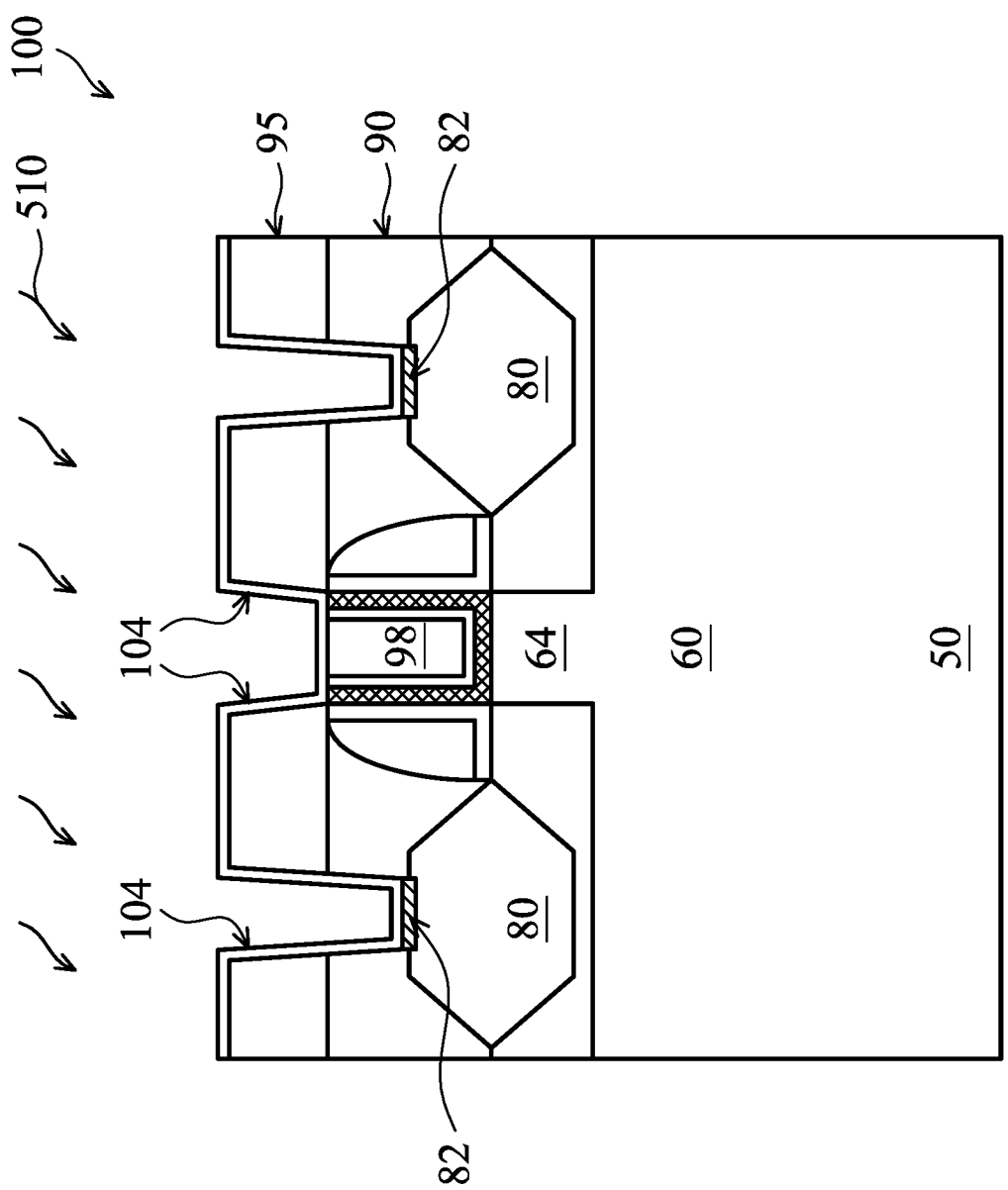

Referring to FIG. 11, a thermal anneal process 510, such as a rapid thermal anneal (RTA) process, is performed after the barrier layer 104 is formed. The thermal anneal process 510 forms silicide regions 82 at the interface between the epitaxial source/drain regions 80 (e.g., epitaxial silicon regions) and the barrier layer 104, in some embodiments. In other embodiments, the thermal anneal process 510 forms germanide regions 82 at the interface between the epitaxial source/drain regions 80 (e.g., epitaxial germanium regions) and the barrier layer 104. In yet other embodiments, the thermal anneal process 510 forms silicon germanide regions (e.g., a region comprising silicide and germanide) 82 at the interface between the epitaxial source/drain regions 80 (e.g., epitaxial regions comprising silicon and germanium) and the barrier layer 104. In the illustrated embodiment, no silicide, germanide, or silicon germanide is formed at the interface between the ILDs 90/95 and the barrier layer 104. In embodiments where the barrier layer 104 does not include a first layer comprising a metal (e.g., Ti or Ta) capable of forming a silicide or germanide, the thermal anneal process 510 may be omitted.

Figure 12:
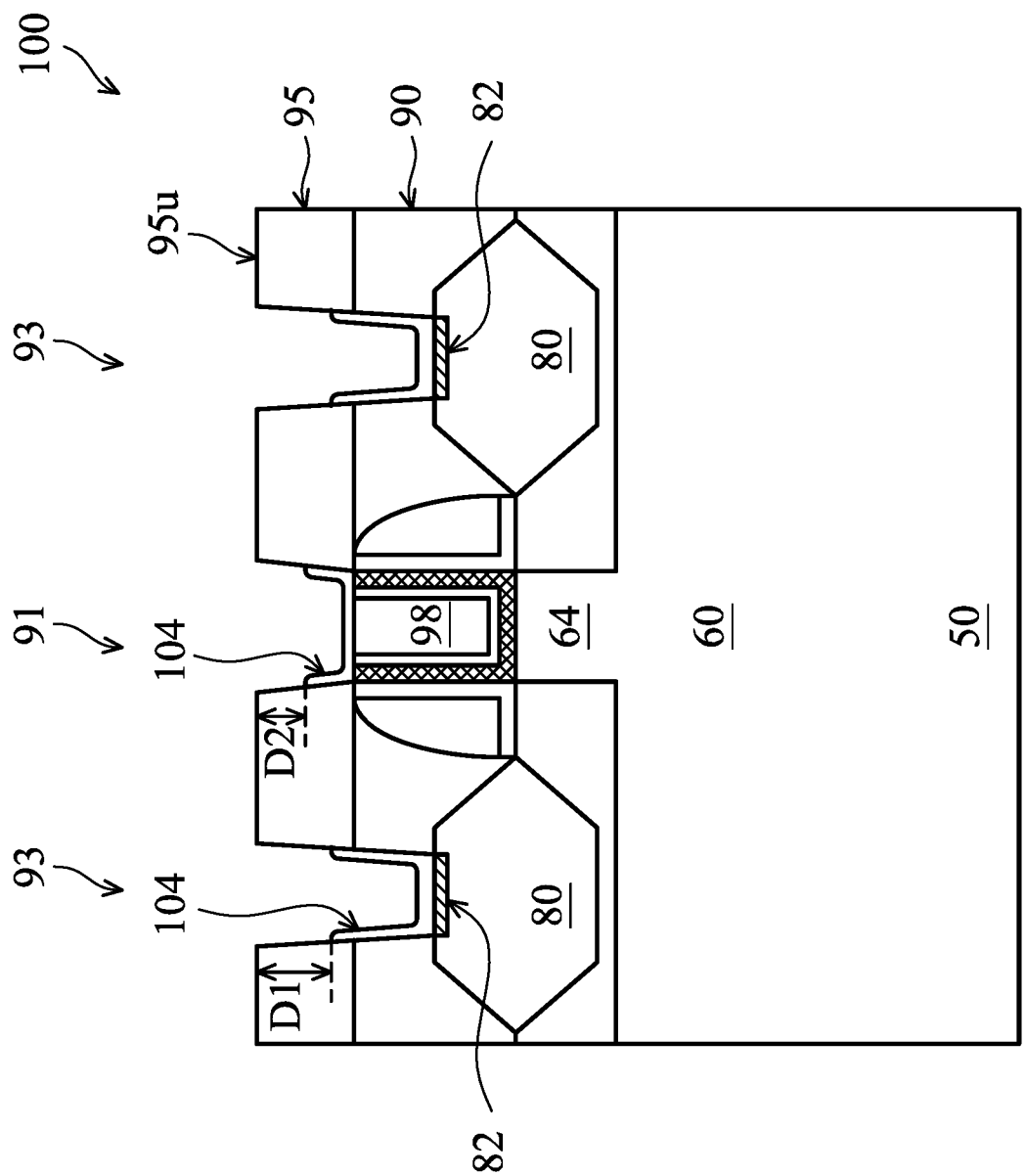

Next, as illustrated in FIG. 12, portions of the barrier layer 104 over the upper surface 95U of the second ILD 95 and along upper sidewalls of the contact openings 91/93 are removed. The removal of the portions of the barrier layer 104 may use a wet etch process, although other suitable removal method may also be used. In an embodiment, a mask layer (not shown), such as a photo resist, is formed at the bottom of the contact openings 91/93 to partially fill the contact openings 91/93, such that portions of the barrier layer 104 disposed on lower sidewalls and bottoms of the contact openings 91/93 are covered by the mask layer. Next, a wet etch process is performed to remove portions of the barrier layer 104 that are not covered by the mask layer. After the wet etch process, the mask layer may be removed by a suitable process such as ashing.

In some embodiments, a first distance D1 between the upper surface 95U of the second ILD 95 and an upper surface of the remaining portions of the barrier layer 104 in the contact openings 93 is between about 20 nm to about 35 nm, although other dimensions for the first distance D1 are also possible and may be determined by, e.g., the process technology and design. In some embodiments, a second distance D2 between the upper surface 95U of the second ILD 95 and an upper surface of the remaining portions of the barrier layer 104 in the contact opening 91 is between about 20 nm to about 35 nm, although other dimensions for the second distance $D_2$ are also possible and may be determined by, e.g., the process technology and design. The first distance D1 and the second distance D2 may be the same in some embodiments. In other embodiments, the first distance D1 and the second distance D2 may be different from each other.

Figure 13:
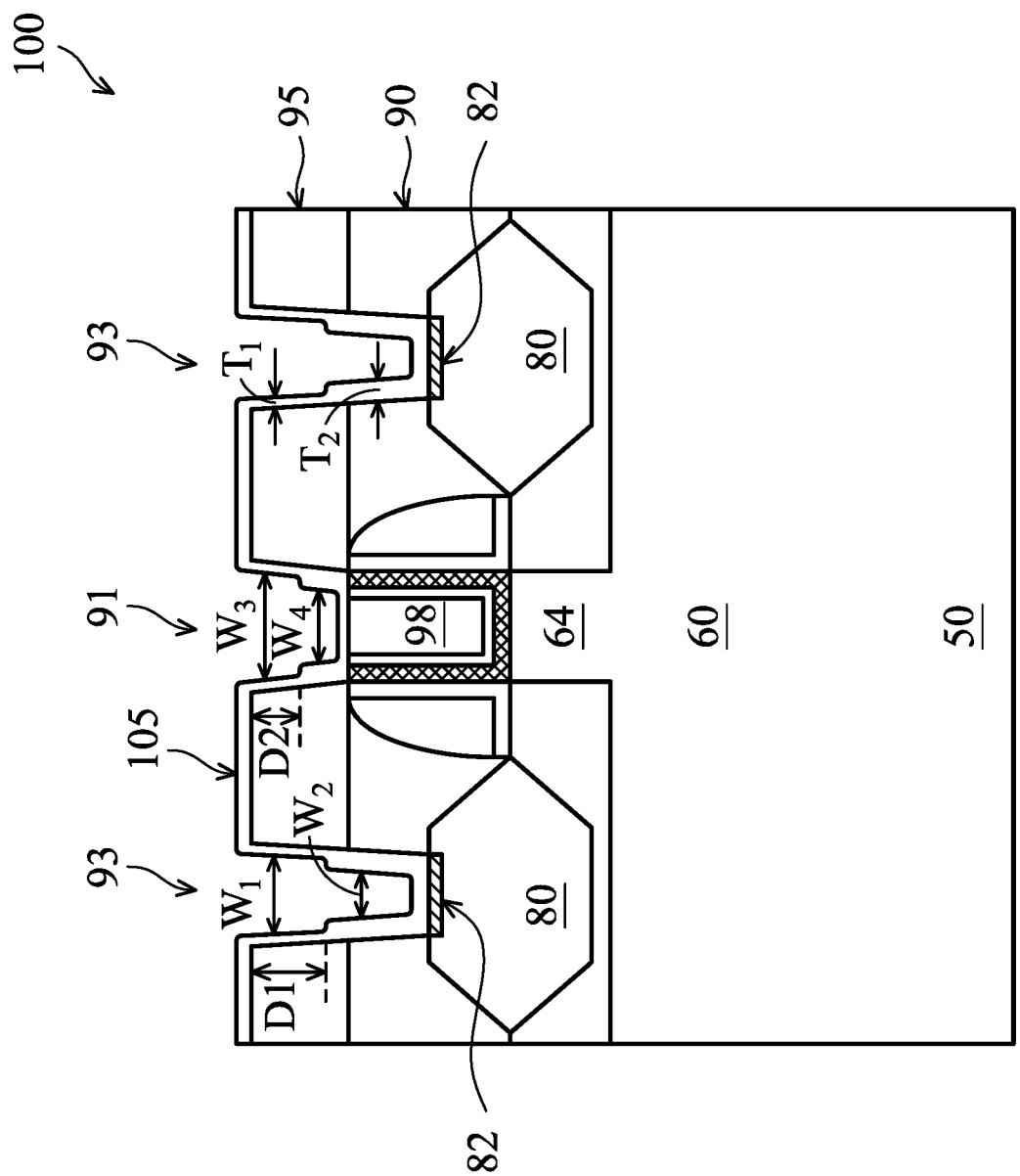

Next, as illustrated in FIG. 13, a second barrier layer is conformally formed over the second ILD 95 and the remaining portions of the barrier layer 104. In some embodiments, the second barrier layer comprises a same material (e.g., TiN, TaN) as the barrier layer 104, therefore, the second barrier layer and the remaining portions of the barrier layer 104 are illustrated as a barrier layer 105 in FIG. 13. Note that due to the remaining portions of the barrier layer 104 (see FIG. 12) at the lower portions of the contact openings 91/93, the barrier layer 105 has a first width T1 for upper portions of the barrier layer 105 and a second with T2 for lower portions of the barrier layer 105, wherein T2 is larger than T1. The upper portions of the barrier layer 105 may refer to the portions of the barrier layer 105 over the second ILD 95, and/or portions of the barrier layer 105 that extend into the contact openings 91/93 by a depth less than or equal to D1 (in contact openings 93) or D2 (in contact openings 91). The lower portions of the barrier layer 105 may refer to portions of the barrier layer 105 that extend into the contact openings 91/93 by a depth larger than a depth of D1 (in contact openings 93) or D2 (in contact openings 91).

As illustrated in FIG. 13, the barrier layer 105 has a step shape at where the upper portion of the barrier layer 105 adjoins the lower portions of the barrier layer 105. A first width $W_1$ of the contact opening 93, measured between opposing upper portions of the barrier layer 105, is larger than a second width W2 of the contact opening 93 measured between opposing lower portions of the barrier layer 105. Similarly, a third width $W_3$ of the contact opening 91, measured between opposing upper portions of the barrier layer 105, is larger than a fourth width $W_4$ of the contact opening 91 measured between opposing lower portions of the barrier layer 105.

In advanced semiconductor process, the high aspect ratio of openings (e.g., contact opening 91/93) may pose a challenge for formation of layers (e.g., a conformal seed layer) within the openings using deposition methods such as PVD, or CVD. The wider opening (e.g., $W_1$ and $W_3$) at the upper portions of the contact openings 91/93 makes it easier for the deposited material to enter the contact openings 91/93 and to form deposited layers, such as an insertion layer 106 (see FIG. 14) and a seed layer 108 (see FIG. 15), while the thicker barrier layer 105 at the lower portions of the contact openings 91/93 may achieve better metal (e.g., copper) diffusion control.

Figure 14:
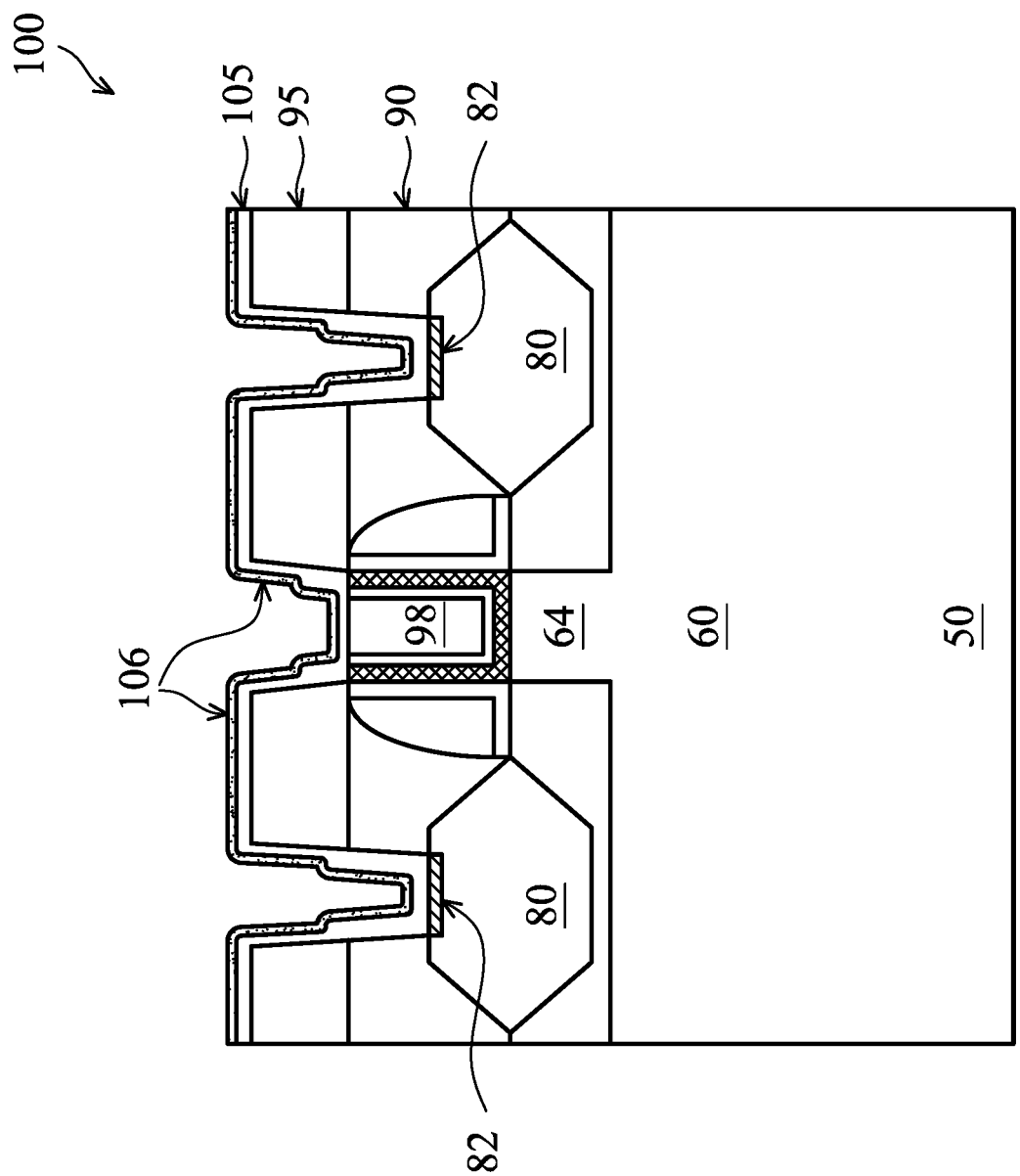

Next, as illustrated in FIG. 14, an electrically conductive insertion layer 106 is conformally formed over the barrier layer 105. In some embodiments, the insertion layer 106 comprises a noble metal, which may resist chemical reactions (e.g., oxidization). The insertion layer 106 may comprise tungsten nitride (WN), titanium nitride (TiN), ruthenium (Ru), platinum (Pt), the like, and may be formed by any suitable formation method such as PVD, CVD, or ALD, as examples. In an exemplary embodiment, the barrier layer 105 is formed of TiN, and the insertion layer 106 is formed of WN. A thickness of the conductive insertion layer 106 is between about 5 angstrom to about 15 angstrom, in some embodiments. In some embodiments, the insertion layer 106 helps to reduce the roughness of a subsequently formed seed layer 108 (e.g., a seed layer comprising Co), thus preventing or reducing voids (e.g., empty spaces) in the conductive layer no (see FIGS. 16 and 19) of the contact plugs 102 formed in subsequent processing, details of which will be described hereinafter. Without being limited to a particular theory, it is believed that seed layers formed over an oxide layer tend to have rough seed particles, which may cause voids in the conductive layer formed over the seed layer. By having the insertion layer (e.g., a noble metal), oxidization is reduced or avoided, thus reducing the seed particle size and resulting in a smoother seed layer, which in turn reduces or prevents voids in the conductive layer formed on the seed layer.

Figure 15:
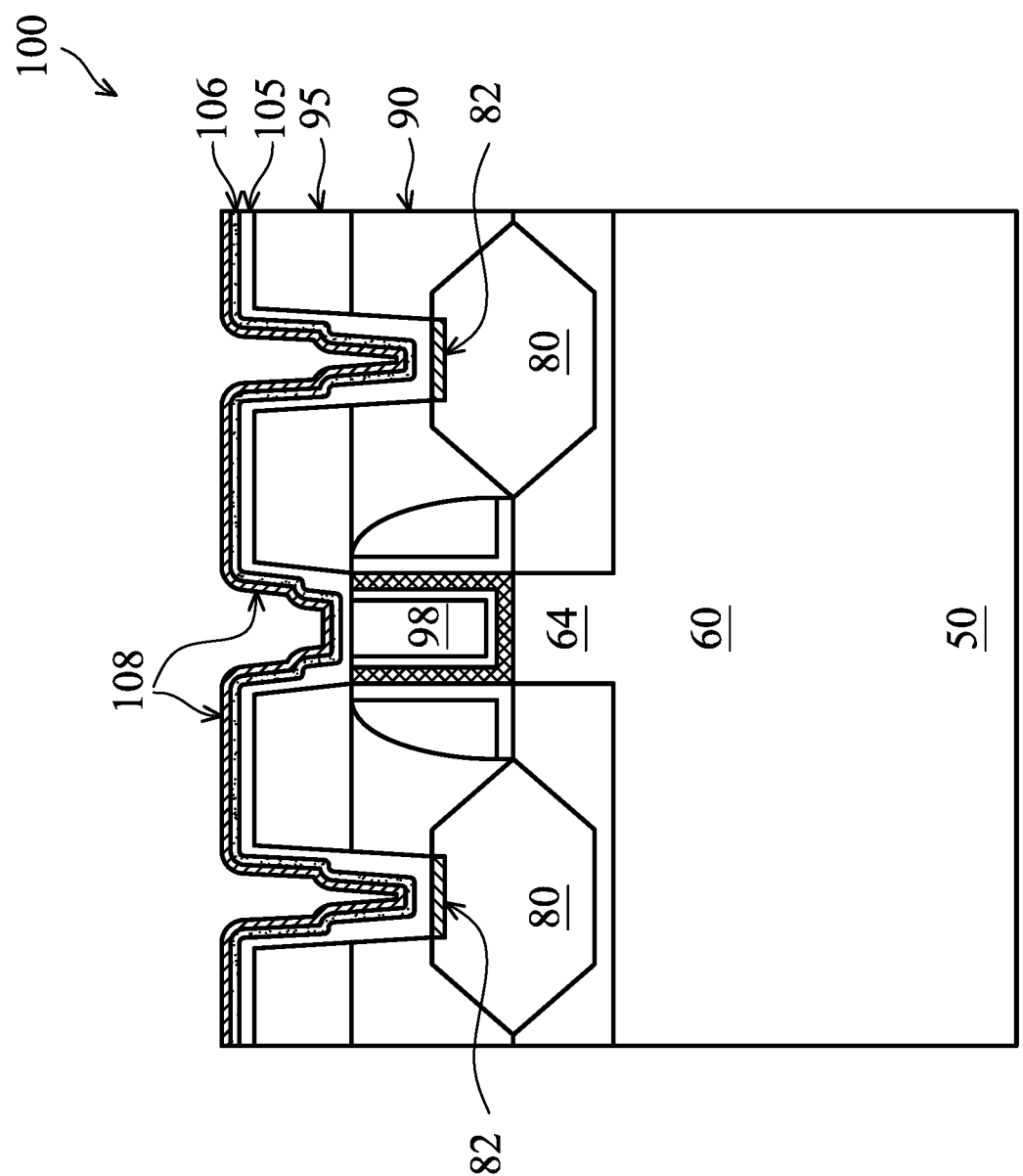

After the insertion layer 106 is formed, a seed layer 108 is formed over the insertion layer 106, as illustrated in FIG. 15. The seed layer 108 may be deposited by PVD, ALD or CVD, and may be formed of tungsten, copper, or copper alloys, although other suitable methods and materials may alternatively be used. In an exemplary embodiment, the seed layer 108 comprises cobalt (Co) and is formed using an ALD process. In the illustrated embodiment, the ALD process for forming the cobalt seed layer 108 is performed using precursors including $H_2$ and Dicobalt Hexacarbonyl Tert-Butylacetylene (CCTBA), where the molecular structure of the CCTBA is Co2(CO)6(HCC(CH3)). The precursor CCTBA used in the ALD process is in a liquid state, in some embodiments. In accordance with some embodiments, the ALD process for forming the cobalt seed layer 108 is performed using a carrier gas of Ar, at a temperature between about 150° C. and about 200° C., such as 175° C., and at a pressure between about 10 torr to about 20 torr, such as 15 torr. A flow rate for $H_2$ is between about 2000 standard cubic center meter per minute (sccm) and about 8000 sccm, such as 4000 sccm, and a flow rate of carrier gas Ar is between about 200 sccm and about 600 sccm, such as 400 sccm, in some embodiments.

Figure 16:
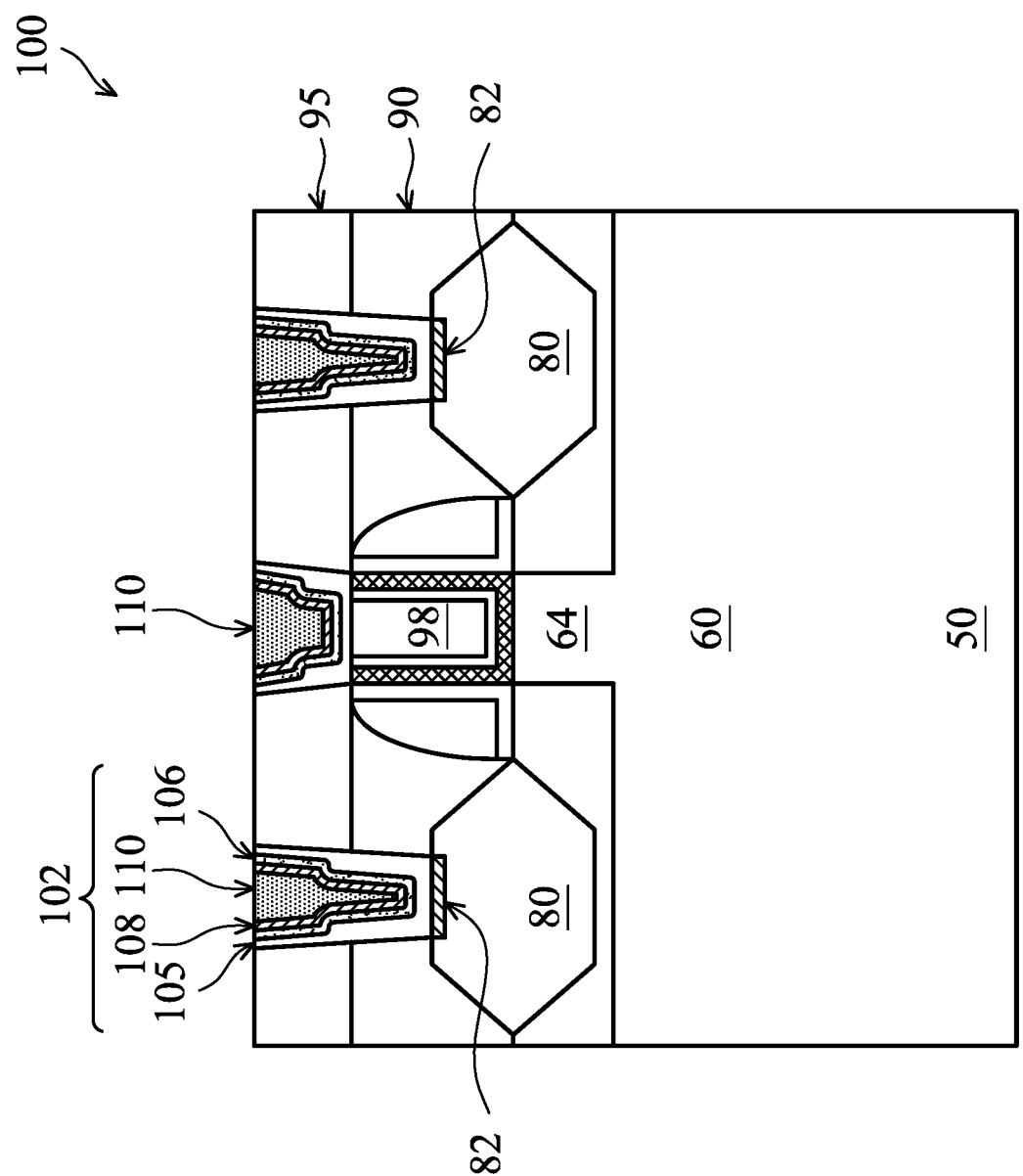

Once the seed layer 108 has been formed, the conductive material 110 may be formed onto the seed layer 108, as illustrated in FIG. 16. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110. In an exemplary embodiment, the conductive material 110 is cobalt (Co), and the conductive material 110 is formed by electroplating the conductive material 110 onto the seed layer 108, filling and overfilling the contact openings 91/93.

Once the contact openings 91/93 have been filled, excess barrier layer 105, insertion layer 106, seed layer 108, and conductive material 110 outside of the contact openings 91/93 may be removed through a planarization process such as chemical mechanical polishing (CMP), although any suitable removal process may be used. Contact plugs 102 are thus formed in the contact openings 91/93.

In some embodiments, when the seed layer 108 is formed, e.g., using an ALD or a CVD process, the seed layer 108 may have a high percentage of carbon (e.g., higher than about 20 atomic percent). The carbon in the seed layer 108 may come from the precursor (e.g., CCTBA) used in the deposition process of the seed layer 108. Such a high percentage (e.g., larger than 20 at. %) of carbon may cause the seed particles (e.g., Co particles) to be rough (e.g., having a size or a diameter larger than about 2 nm to about 10 nm). The rough seed particles may result in a non-continuous seed layer 108. For example, the seed layer 108 may have holes or discontinuities that expose an underlying layer (e.g., the insertion layer 106) of the seed layer 108. In the discussion hereinafter, the holes and the discontinuities of the seed layer 108 may be used interchangeably, and the seed layer 108 that has holes or discontinuities may be described as being discontinuous. When plating without the insertion layer 106, voids (e.g., empty spaces) may be formed in portions of the conductive material 110 adjacent (e.g., over) the holes/discontinuities in the seed layer 108, due to the difficulty of plating the conductive material 110 over the holes/discontinuities. Voids in the contact plugs 102 increase the electrical resistance of the contact plugs and adversely affect the reliability of the electrical connection of the semiconductor devices formed.

The present disclosure reduces or prevents the formation of voids in the conductive material 110 of the contact plugs 102 by forming the insertion layer 106 between the barrier layer 105 and the seed layer 108. During the plating process, the conductive material 110 may be plated over the seed layer 108 and portions of the insertion layer 106 exposed by the holes/discontinuities in the seed layer 108, thus the conductive material 110 may be formed continuously (e.g., with no or reduced voids) over the surfaces of the seed layer 108, regardless of whether there are holes or discontinuities in the seed layer 108. The contact plugs 102 formed in the present disclosure have little or no voids, thus having low electrical resistance and providing reliable electrical connections for the semiconductor device formed.

Figure 17:
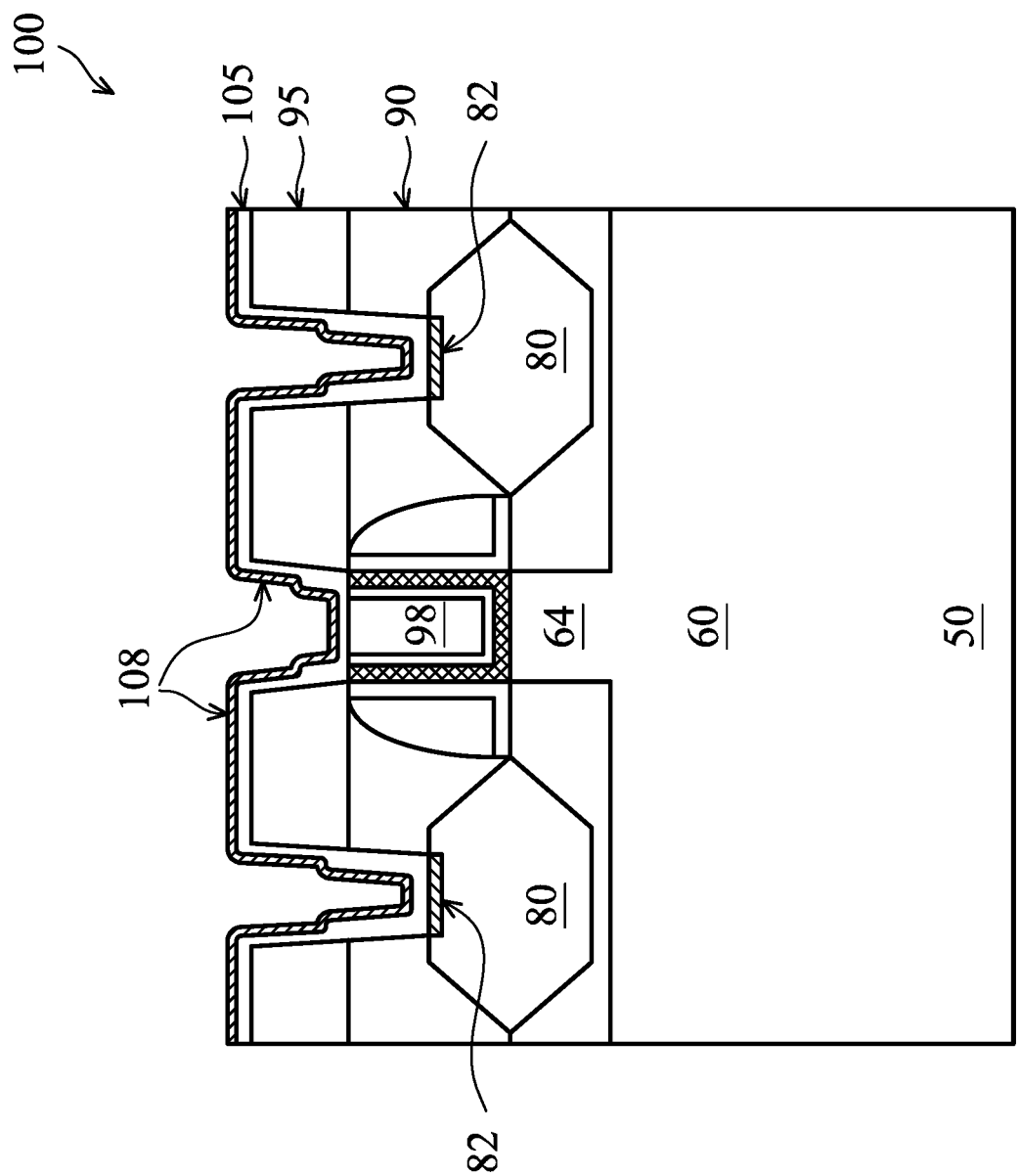
FIGS. 17-19 are cross-sectional views of a FinFET device at various stages of fabrication, in an embodiment.
Figure 18:
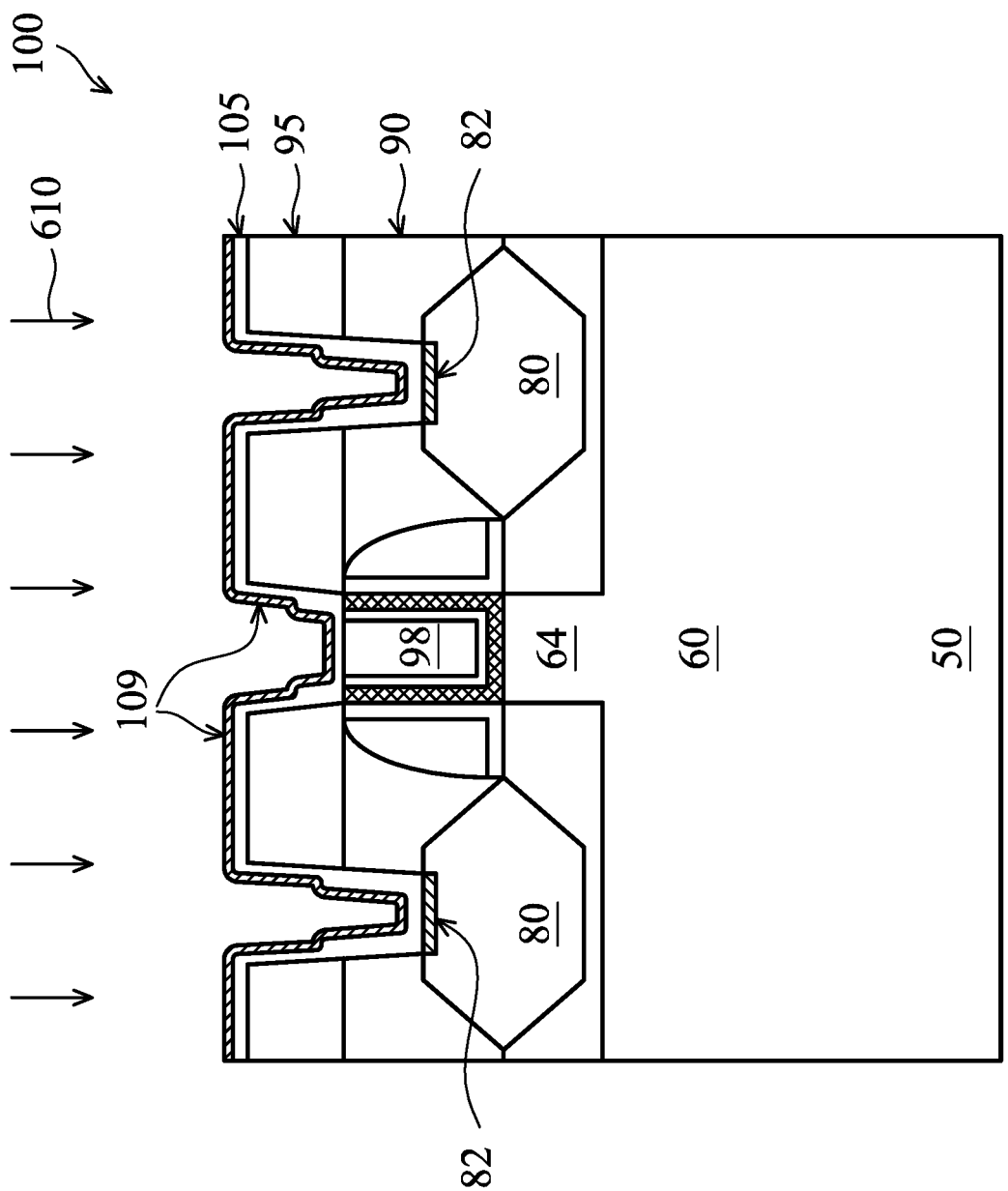
Figure 19:
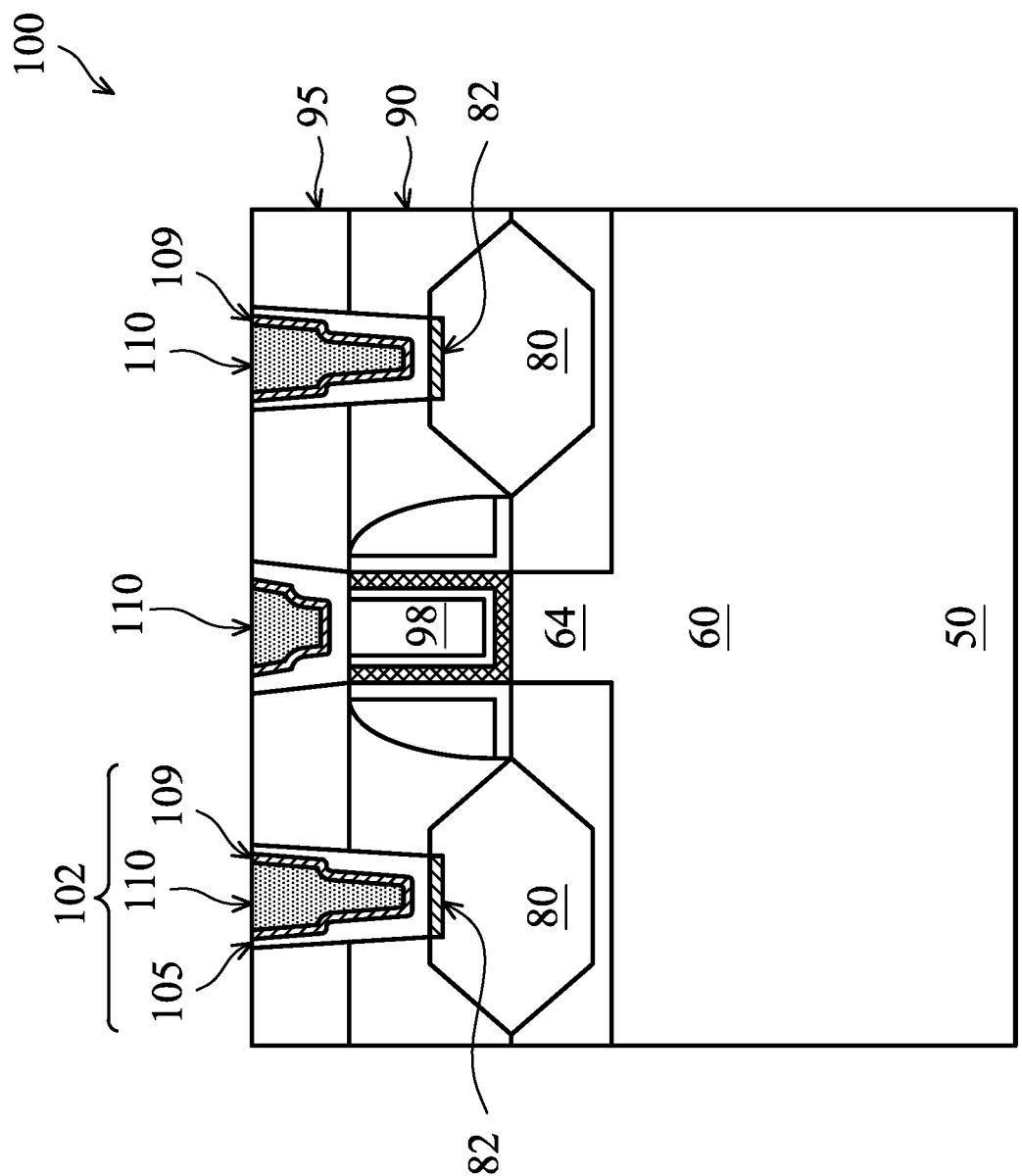

FIGS. 17-19 illustrate cross-sections views of a FinFET device 100 at various stages of fabrication in accordance with another embodiment. The processing step illustrated in FIG. 17 follows that illustrated in FIG. 13, therefore, FIGS. 2-13 and 17-19 illustrate the processing steps of another embodiment.

As illustrated in FIG. 17, after the barrier layer 105 is formed, a seed layer 108 is formed over the barrier layer 105. The seed layer 108 may be deposited by PVD, ALD or CVD, and may be formed of tungsten, copper, or copper alloys, although other suitable methods and materials may alternatively be used. In an exemplary embodiment, the seed layer 108 comprises cobalt (Co) and is formed using an ALD process. In some embodiments, the ALD process for forming the cobalt seed layer 108 is performed using precursors including $H_2$ and CCTBA (e.g., CCTBA in liquid state), using a carrier gas of Ar, at a temperature between about 150° C. and about 200° C., such as 175° C., and at a pressure between about 10 torr to about 20 torr, such as 15 torr. A flow rate for $H_2$ is between about 2000 sccm and about 8000 sccm, such as 4000 sccm, and a flow rate of carrier gas Ar is between about 200 sccm and about 600 sccm, such as 400 sccm, in some embodiments.

Next, in FIG. 18, a process 610 is performed to treat the seed layer 108 such that a percentage of carbon in the seed layer 108 is reduced. For example, a plasma process using one or more reactive species may be performed, and the reactive species may react with the carbon in the seed layer 108 to form a product (e.g., a gaseous product) that can be easily removed from the deposition chamber, thereby reducing the percentage of carbon in the seed layer 108. After the process 610 (e.g., a plasma process) is finished, the seed layer 108 turns into treated seed layer 109. In some embodiments, a plasma process 610 is performed using a plasma of $H_2$. The plasma used in the plasma process 610 is generated in the deposition chamber, in accordance with an embodiment. A flow rate for $H_2$ may be between about 2000 sccm to about 8000 sccm, such as 4000 sccm. The pressure for the plasma process 610 may be between about 2 torr to about 10 torr, such as 5 torr, and an RF power for the plasma process may be between about 200 watt to about 600 watt, such as 400 watt. In some embodiments, the $H_2$ plasma reacts with the carbon in the seed layer 108 and generates a gaseous product (e.g., CO), which is evacuated from the deposition chamber. The chemical reaction equation for the plasma processing 610 using $H_2$ is given below:

$$Co(CO)x(HC{\equiv}CtBu)+H_2 \rightarrow Co+xCO+(HC{=}HC\text{-}tBu)H \quad (1)$$

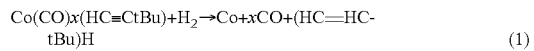

When the seed layer 108 is formed, e.g., using an ALD or a CVD process, the seed layer 108 may have a high percentage of carbon (e.g., higher than about 20 at. %). As discussed above, such a high percentage of carbon may cause voids in the contact plugs formed subsequently, due to the rough seed particles (e.g., Co seed particles). The plasma process 610 disclosed herein reduces the percentage of carbon of the seed layer. In some embodiments, after the plasma process 610, the percentage of carbon of the treated seed layer 109 is below about 20 at. %. Lowering the carbon percentage reduces the roughness (e.g., size) of the seed particles, which in turn reduces the discontinuities or holes in the treated seed layer 109. As a result, voids in the contact plugs 102 are reduced or prevented.

Next, in FIG. 19, the conductive material 110 may be formed onto the treated seed layer 109. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, electroplating, and reflow, may be used to form the conductive material 110. In an exemplary embodiment, the conductive material 110 is cobalt (Co), and the conductive material 110 is formed by electroplating the conductive material 110 onto the treated seed layer 109, filling and overfilling the contact openings 91/93.

Once the contact openings 91/93 have been filled, excess barrier layer 105, treated seed layer 109, and conductive material 110 outside of the contact openings 91/93 may be removed through a planarization process such as chemical mechanical polishing (CMP), although any suitable removal process may be used. Contact plugs 102 are thus formed in the contact openings 91/93.

Variations and modifications of the presently disclosed embodiments are possible. For example, the formation of the replacement gate 97 may follow similar processing steps as discussed above for forming contact plugs 102. As an example, referring to FIG. 8, after the gate dielectric layer 96 is formed, a seed layer (e.g., a Co seed layer) may be formed using, e.g., ALD deposition, and the deposited seed layer may be treated using a plasma process (e.g., plasma process 610) to reduce its carbon percentage (thus reducing its seed particle roughness), before a plating process is used to form gate electrode 98 over the treated seed layer, similar to the processing illustrated in FIGS. 17-19. As another example, still referring to FIG. 8, after the gate dielectric layer 96 is formed, a barrier layer, an insertion layer, and a seed layer are successively formed over the gate dielectric layer 96, before a plating process is used to form the gate electrode 98, similar to the processing illustrated in FIGS. 10-16. The optional thermal anneal process 510 may or may not be performed, depending on, e.g., the design.

As yet another example, the embodiment illustrated in FIGS. 17-19 may be combined with the embodiment illustrated in FIGS. 2-16. In particular, after the seed layer 108 is formed over the insertion layer 106 (as illustrated FIG. 15) and before the formation of the conductive material 110 (as illustrated FIG. 16), a plasma process similar to the plasma process 610 of FIG. 18 may be performed to reduce the carbon percentage of the seed layer 108. After the plasma process is finished, the conductive material 110 may be formed over the plasma treated seed layer. These and other variations or modifications to the embodiment methods disclosed herein are possible, and are fully intended to be included within the scope of the present disclosure.

Figure 20:
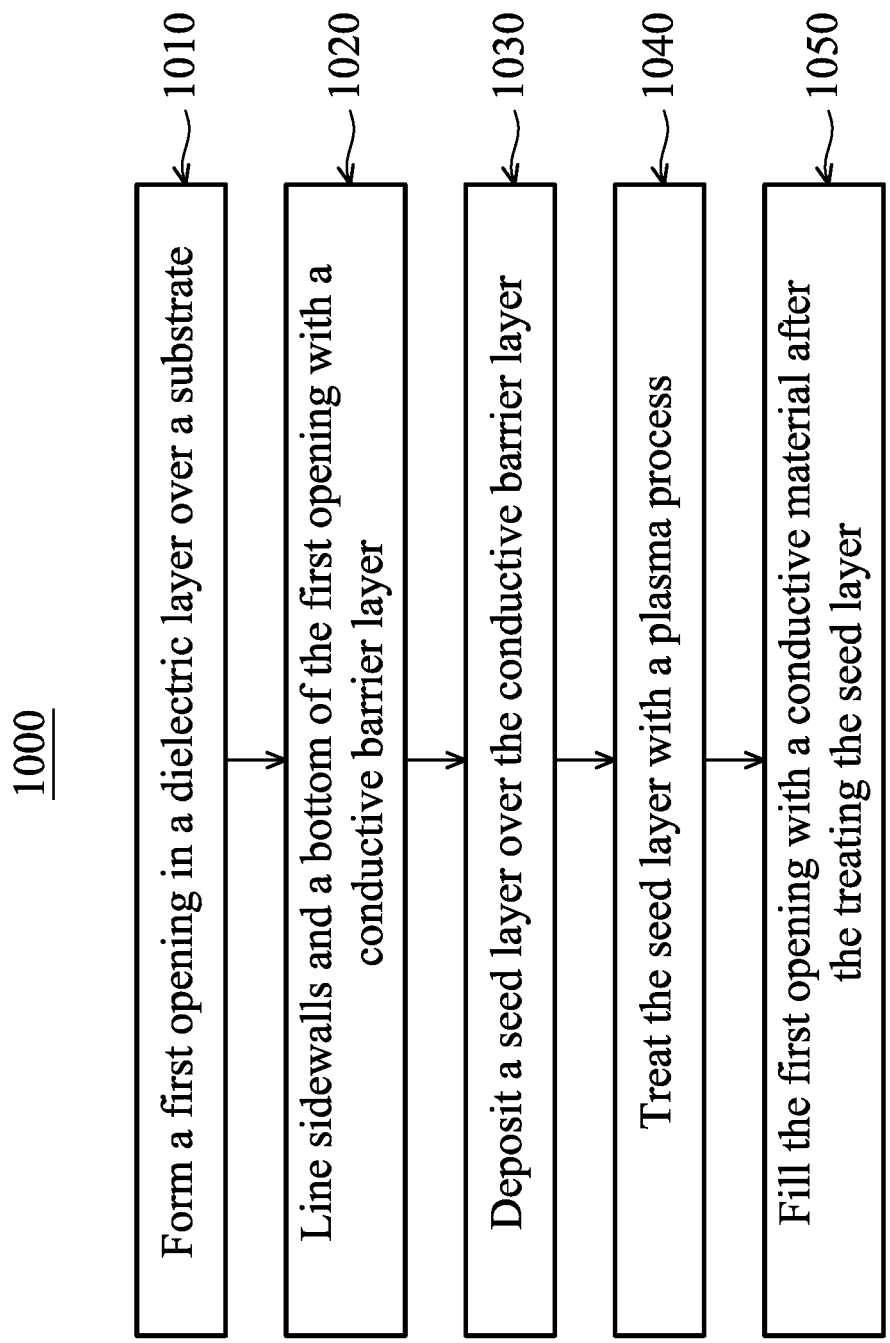
FIG. 20 illustrates a flow chart of a method of fabricating a semiconductor device, in accordance with some embodiments.

FIG. 20 illustrates a flow chart of a method of fabricating a semiconductor structure, in accordance with some embodiments. It should be understood that the embodiment method shown in FIG. 20 is merely an example of many possible embodiment methods. One of ordinary skill in the art would recognize many variations, alternatives, and modifications. For example, various steps as illustrated in FIG. 20 may be added, removed, replaced, rearranged and repeated.

Referring to FIG. 20, at step 1010, a first opening is formed in a dielectric layer over a substrate. At step 1020, sidewalls and a bottom of the first opening are lined with a conductive barrier layer. At step 1030, a seed layer is deposited over the conductive barrier layer. At step 1040, the seed layer is treated with a plasma process. At step 1050, the first opening is filled with a conductive material after the treating the seed layer.

Embodiments may achieve advantages. In one embodiment, by treating the deposited seed layer with a plasma process before plating, the carbon percentage of the treated seed layer is reduced (e.g., to lower than about 20 at. %). The lower carbon percentage reduces the roughness of the seed particles, thus reducing the holes/discontinuities of the treated seed layer, which in turn reduces or prevents the formation of voids in the contact plugs. In another embodiments, a conductive insertion layer is formed between the barrier layer and the seed layer. The conductive insertion layer may facilitate the plating of conductive material (e.g., conductive material 110) continuously over the seed layer, regardless of whether there are holes/discontinuities in the seed layer. As a result, contact plugs with little or no voids are formed by the methods disclosed in the present disclosure. Contact plugs with no or little voids provide reliable electrical connection for the device formed and have low electrical resistance.

In some embodiments, a method includes forming a first opening in a dielectric layer over a substrate, lining sidewalls and a bottom of the first opening with a conductive barrier layer, and depositing a seed layer over the conductive barrier layer. The method further includes treating the seed layer with a plasma process, and filling the first opening with a conductive material after the treating the seed layer.

In other embodiments, a method of forming a contact in a semiconductor device includes depositing a conductive barrier layer over sidewalls and a bottom of an opening in a dielectric layer of the semiconductor device, forming a conductive insertion layer over the conductive barrier layer, forming a seed layer over the conductive insertion layer, the seed layer having holes, and plating a conductive material over the seed layer to fill the opening.

In yet other embodiments, a method of forming a Fin Field-Effect Transistor (FinFET) includes forming a fin protruding above a substrate, forming a dielectric layer over the fin, forming a first opening in the dielectric layer, the first opening exposing a source/drain region of the fin, and forming a conductive barrier layer lining the first opening. Forming the conductive barrier layer includes depositing a first conductive layer over sidewalls and a bottom of the first opening, and depositing a second conductive layer over the first conductive layer, the second conductive layer being different from the first conductive layer. The method further includes performing a thermal anneal process after forming the conductive barrier layer, depositing a seed layer comprising carbon over the conductive barrier layer, treating the seed layer to reduce a percentage of carbon in the seed layer, and plating a conductive material over the seed layer to fill the first opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of forming a semiconductor device, the method comprising:
   forming an opening in a dielectric layer to expose an electrically conductive feature;
   forming a first barrier layer along sidewalls and a bottom of the opening;
   removing upper portions of the first barrier layer while keeping lower portions of the first barrier layer proximate to the electrically conductive feature, wherein after removing the upper portions of the first barrier layer, upper sidewalls of the dielectric layer are exposed; and
   forming a second barrier layer over the exposed upper sidewalls of the dielectric layer and over the lower portions of the first barrier layer, wherein the second barrier layer and the lower portions of the first barrier layer form a non-conformal barrier layer, wherein a thickness of the non-conformal barrier layer has a step change between upper portions of the non-conformal barrier layer and lower portions of the non-conformal barrier layer;
   forming a seed layer over the non-conformal barrier layer;
   filling the opening with a conductive material after forming the seed layer; and
   further comprising, before filling the opening, treating the seed layer with a plasma process;
   wherein the plasma process reduces a percentage of carbon in the seed layer.

2. The method of claim 1, wherein a thickness of the upper portions of the non-conformal barrier layer is smaller than a thickness of the lower portions of the non-conformal barrier layer.

3. The method of claim 1, further comprising, before forming the seed layer, forming an insertion layer over the non-conformal barrier layer.

4. The method of claim 3, wherein forming the insertion layer comprises forming the insertion layer using a noble metal.

5. The method of claim 1, wherein forming the first barrier layer further comprises:
   forming a first sub-layer of the first barrier layer along the sidewalls and the bottom of the opening, the first sub-layer comprising a first metal; and
   forming a second sub-layer of the first barrier layer over the first sub-layer, the second sub-layer comprising a nitride of the first metal.

6. The method of claim 5, wherein the second barrier layer is formed using the nitride of the first metal.

7. The method of claim 5, wherein forming the first barrier layer further comprises performing a thermal anneal process after the second sub-layer of the first barrier layer is formed and before the second barrier layer is formed.

8. A method of forming a semiconductor device, the method comprising:
   forming a gate structure over a substrate;
   forming a source/drain region adjacent to the gate structure;
   forming at least one dielectric layer over the gate structure and over the source/drain region;
   forming a first opening and a second opening in the at least one dielectric layer to expose the source/drain region and the gate structure, respectively;
   forming a non-conformal conductive barrier layer lining first sidewalls and a first bottom of the first opening, and lining second sidewalls and a second bottom of the second opening, wherein upper portions of the non-conformal conductive barrier layer distal from the substrate is thinner than lower portions of the non-conformal conductive barrier layer proximate to the substrate, wherein there is a step change from the upper portion of the non-conformal conductive barrier layer to the lower portion of the non-conformal conductive barrier layer;
   forming a seed layer over the non-conformal conductive barrier layer;
   filling the first opening and the second opening with a conductive material after forming the seed layer; and
   further comprising reducing a percentage of carbon in the seed layer before filling the first opening and the second opening;
   wherein reducing the percentage of carbon in the seed layer comprises treating the seed layer with a plasma process.

9. The method of claim 8, further comprising, after forming the non-conformal conductive barrier layer and before forming the seed layer, forming a conductive insertion layer over the non-conformal conductive barrier layer.

10. The method of claim 9, wherein the conductive insertion layer is formed using WN, TiN, Ru or Pt.

11. A semiconductor device comprising:
    a gate structure over a substrate;
    source/drain regions on opposing sides of the gate structure;
    dielectric layers over the gate structure and the source/drain regions; and
    a first contact plug extending through the dielectric layers and electrically coupled to a first source/drain region of the source/drain regions, the first contact plug comprising:
    an electrically conductive material;
    a seed layer around the electrically conductive material;
    a non-conformal barrier layer around the seed layer, wherein the non-conformal barrier layer contacts the dielectric layers, wherein the non-conformal barrier layer has an upper portion distal to the substrate and has a lower portion proximate to the first source/drain region, the upper portion and the lower portion of the non-conformal barrier layer having different thicknesses, and wherein there is a step change between the upper portion and the lower portion of the non-conformal barrier layer; and
    wherein the first contact plug further comprises an insertion layer between the seed layer and the non-conformal barrier layer.

12. The semiconductor device of claim 11, wherein a thickness of the upper portion of the non-conformal barrier layer is smaller than a thickness of the lower portion of the non-conformal barrier layer.

13. The semiconductor device of claim 12, wherein the seed layer comprises cobalt and carbon, wherein an atomic percentage of carbon in the seed layer is less than about 20 at. %.

14. The semiconductor device of claim 11, wherein the insertion layer comprises a noble metal.

* * * * *